US006884478B2

(12) United States Patent
Alivisatos et al.

(10) Patent No.: US 6,884,478 B2
(45) Date of Patent: Apr. 26, 2005

(54) SEMICONDUCTOR LIQUID CRYSTAL COMPOSITION AND METHODS FOR MAKING THE SAME

(75) Inventors: A. Paul Alivisatos, Oakland, CA (US); Liang-shi Li, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 163 days.

(21) Appl. No.: 10/280,135

(22) Filed: Oct. 23, 2002

(65) Prior Publication Data

US 2003/0136943 A1 Jul. 24, 2003

Related U.S. Application Data

(60) Provisional application No. 60/395,064, filed on Jul. 12, 2002, and provisional application No. 60/346,253, filed on Oct. 24, 2001.

(51) Int. Cl.$^7$ .................. C09K 19/52; H01L 31/0256
(52) U.S. Cl. ................ 428/1.1; 252/299.01; 252/299.5; 136/252; 136/260; 136/263; 136/264
(58) Field of Search ...................... 428/1.1; 252/299.01, 252/299.5; 345/87, 91; 136/252, 260, 263, 264

(56) References Cited

U.S. PATENT DOCUMENTS

| | | | |
|---|---|---|---|
| 4,625,071 A | 11/1986 | Delahoy et al. | |
| 5,262,357 A | 11/1993 | Alivisatos et al. | |
| 5,331,183 A | 7/1994 | Sariciftci et al. | |
| 5,350,459 A | 9/1994 | Suzuki et al. | |
| 5,350,644 A | 9/1994 | Graetzel et al. | |
| 5,454,880 A | 10/1995 | Sariciftci et al. | |
| 5,504,323 A | 4/1996 | Heeger et al. | |
| 5,505,928 A | 4/1996 | Alivisatos et al. | |
| 5,523,555 A | 6/1996 | Friend et al. | |
| 5,525,440 A | 6/1996 | Kay et al. | |
| 5,537,000 A | 7/1996 | Alivisatos et al. | |
| 5,594,263 A | 1/1997 | Bedard et al. | |
| 5,670,791 A | 9/1997 | Halls et al. | |
| 5,698,048 A | 12/1997 | Friend et al. | |
| 5,751,018 A | 5/1998 | Alivisatos et al. | |
| 5,804,836 A | 9/1998 | Heeger et al. | |
| 5,847,787 A | 12/1998 | Fredley et al. | |
| 5,990,479 A | 11/1999 | Weiss et al. | |
| 6,013,871 A | 1/2000 | Curtin | |
| 6,207,392 B1 | 3/2001 | Weiss et al. | |
| 6,225,198 B1 | 5/2001 | Alvisatos et al. | |
| 6,277,740 B1 | 8/2001 | Goldstein | |
| 6,306,736 B1 | 10/2001 | Alivisatos et al. | |
| 6,423,551 B1 | 7/2002 | Weiss et al. | |
| 6,440,213 B1 | 8/2002 | Alivisatos et al. | |
| 6,503,382 B1 * | 1/2003 | Bartlett et al. ................ 205/67 |
| 2002/0006723 A1 | 1/2002 | Goldstein | |
| 2002/0016306 A1 | 2/2002 | Hutchison et al. | |

FOREIGN PATENT DOCUMENTS

WO  WO 99/00536  1/1999

OTHER PUBLICATIONS

CAPLUS 1999:469244.*
Abdou, Mohamed S. A., et al.; "Interaction of Oxygen with Conjugated Polymers: Charge Transfer Complex Formation with Poly(3–alkylthiophenes);" *J. Am. Chem. Soc.*; 1997; pp. 4516–4524; vol. 119; No. 19; American Chemical Society.
Arango, Alexi et al.; "Efficient Titanium Oxide/Conjugated Polymer Photovoltaics for Solar Energy Conversion;" *Advanced Materials*; Nov. 16, 2000; pp. 1689–1692; vol. 12; No. 22; WILEY–VCH Verlag GmbH; D–69469 Weinheim.
Ataev, et al., "Zinc Oxide Whiskers," Tech. Phys. Lett., vol. 23, No. 11, American Institute of Physics, pp. 842–843 (Nov. 1997).
Bach, U., et al.; "Solid–State Dye–Sensitized Mesoporous $TiO_2$ Solar Cells with High Photon–to Electron Conversion Efficiencies;" *Nature*: Oct. 8, 1998; pp. 853–585; vol. 395; Macmillan Publishers Ltd.
Berman, et al., "Total Alignment of Calcite at Acidic Polydiacetylene Films: Cooperativity at the Organic–Inorganic Interface," Science, vol. 269, pp. 515–518, (Jul. 28, 1995).
Chartier, P., et al.; "Hybrid Organic–Inorganic Photovoltaic Junctions: Case of the All Thin–Film CdSe/poly93–methylthiophene) Junction;" *Solar Energy Materials and Solar Cells*: 1998; pp. 413–421; vol. 52; Elsevier Science B.V.
Chemseddine, et al., "Nanostructuring Titania: Control over Nanocrystal Structure, Size, Shape, and Organization," Eur. J. Inorg. Chem., WILEY–VCH Verlag GmbH, pp. 235–245, (1999).
Chen, et al., Simple Solution–Phase Synthesis of Soluble CdS and CdSe Nanorods, Chem. Mater., vol. 12, American Chemical Society, pp. 1516–1518, (2000).
Cho, "How Molecular Beam Epitaxy (MBE) Began and its Projection Into the Future," Journal of Crystal Growth, 201/202, Elsevier Science B.V. pp. 1–7, (1999).
Cui, et al., "Nanowire Nanosensors for Highly Sensitive and Selective Detection of Biological and Chemical Species," Science, vol. 293, pp. 1289–1292, (Aug. 17, 2001).
Dittmer, J. J., et al.; "Crystal Network Formation in Organic Solar Cells;" *Solar Cells*: 2000; pp. 53–61; vol. 61; Elsevier Science B.V.
Dittmer, Janke, et al.; "Electron Trapping in Dye/Polymer Blend Photovoltaic Cells/" *Advanced Materials*; Sep. 1, 2000; pp. 1270–1274; vol. 12; No. 17; WILEY–VCH Verlag GmbH; D–69469 Weinheim.

(Continued)

Primary Examiner—Shean C. Wu
(74) *Attorney, Agent, or Firm*—Townsend and Townsend and Crew LLP

(57) ABSTRACT

Semiconductor liquid crystal compositions and methods for making such compositions are disclosed. One embodiment of the invention is directed to a liquid crystal composition including a solvent and semiconductor particles in the solvent. The solvent and the semiconductor particles are in an effective amount in the liquid crystal composition to form a liquid crystal phase.

39 Claims, 4 Drawing Sheets

OTHER PUBLICATIONS

Gao, Jun, et al.; "Efficient Photodetectors and Photovoltaic Cells From Composites of Fullerenes and Conjugated Polymers: Photoinduced Electron Transfer;" *Synthetic Metals*; 1997; pp. 979–980; vol. 84; Elsevier Science B.V.

Gao, Jun, et al.; "Polymer p–1–n Junction Photovoltaic Cells**," *Advanced Materials*: 1998; pp. 692–695; vol. 10; No. 9; WILEY–VCH Verlag GmbH; D–69469 Weinheim.

Ginger, D. S., et al.; "Photoinduced Electron Transfer From Conjugated Polymers to CdSe Nanocrystals;" *Physical Review B*; Apr. 15, 1999; pp. 10622–10629; vol. 59; No. 16; The American Physical Society.

Granström, M., et al.; "Laminated Fabrication of Polymeric Photovoltaic Diodes;" *Nature*; Sep. 17, 1998; pp. 257–260; vol. 395.

Granström, Magnus, et al.; "High Efficiency Polymer Photodiodes;" *Synthetic Metals*: 1999; pp. 957–958; vol. 102; Elsevier Science B.V.

Grätzel, Michael; Nanocrystalline Thin–Film PV Cells; *Mrs Bulletin*: 1993; pp. 61–66.

Greenham, N. C., et al.; "Charge Separation and Transport in Conjugated–Polymer/Semiconductor–Nanocrystal Composites Studies by Photoluminescence Quenching and Photoconductivity;" *Physical Review B*; Dec. 15, 1996; pp. 17628–17837; vol. 54; No. 24; The American Physical Society.

Halls, J. J. M., et al.; "Charge– and Energy–Transfer Processes at Polymer/Polymer Interfaces: A joint Experimental and Theoretical Study;" *Physical Review B*: Aug. 15, 1999; pp. 5721–5726; vol. 60; No. 8; The American Physical Society.

Halls, J. J. M., et al.; "Efficient Photodiodes From Interpenetrating Polymer Networks;" *Nature*; Aug. 10, 1995; pp. 498–500; vol. 376.

Halls, J. J. M., et al.; "Exciton Diffusion and Dissociation in a Poly(P–Phenylenevinylene)/$C_{80}$ Heterojunction Photovoltaic Cell;" *Appl. Phys. Lett.*: May 27, 1996; pp. 3120–3122; vol. 68; No. 22; American Institute of Physics.

Halls, J. J. M., et al.; "The Photovoltaic Effect in a Poly(P-phenylenevinylene) / Perylene Heterojunction;" *Synthetic Metals*; 1997; pp. 1307–1308; vol. 85; Elsevier Science B.V.

Harrison, M. G., et al.; "Analysis of the Photocurrent Action Spectra of MEH–PPV Polymer Photodiodes;" *Physical Review B*; Mar. 15, 1997; pp. 7831–7849; vol. 55; No. 12; The American Physical Society.

Hiramoto, Masahiro, et al.; "Field–activated Structural Traps at Organic Pigment/Metal Interfaces Causing Photocurrent Multiplication Phenomena;" *Applied Physics Letters*: Nov. 2, 1998; pp. 2627–2629; vol. 73; No. 18.

Holmes, et al., "Control of Thickness and Orientation of Solution–Grown Silicon Nanowires," Science, vol. 287, pp. 1471–1473, (Feb. 25, 2000).

Hu, et al., "Chemistry and Physics in One Dimension: Synthesis and Properties of Nanowires and Nanotubes," Acc. Chem. Res., vol. 32, No. 5, Accounts of Chemical Research, pp. 435–445, (1999).

Huang, S. Y., et al.; "Charge Recombination in Dye–Sensitized Nanocrystalline $TiO_2$ Solar Cells;" *J. Phys. Chem. B*; 1997; pp. 2576–2582; vol. 101; American Chemical Society.

Huynh, Wendy Uyen; "Nanocrystal–Polymer Solar Cells;" May 2002; Dissertation U.C. Berkeley Chemistry Department.

Ito, "Simple Criterion for Wurtzite–Zine–Blende Polytypism in Semiconductors," Jpn. J. Appl. Phys., vol. 37, Part 2, No. 108, Publication Board, Japanese Journal of Applied Physics, pp. L1217–L1220, (Oct. 15, 1998).

Jin, et al., "Photoinduced Conversion of Silver Nanospheres to Nanoprisms," Science, vol. 294, pp. 1901–1903, (Nov. 30, 2001).

Kasem, K. K.; "Photo–electrochemistry et Polymer/Semiconductur Interface;" *Journal of Materials Science*: 1999; pp. 5237–5242; vol.34.

Kavan, Ladislav, et al.; "Quantum Size Effects in Nanocrystalline Semiconducting $TiO_2$ Layers Prepared by Anodic Oxidative Hydrolysis of $TiCl_3$;" *J. Phys. Chem.*; 1993; pp. 9493–9498; vol. 97; American Chemical Society.

Köhler, A., et al.; "Charge Separation in Localized and Delocalized Electronic Semiconductors;" *Nature*; Apr. 30, 1998; pp. 903–906; vol. 392.

Krasnikov, V.V., et al.; "Interpenetrating Morphologies for Photovoltaic Devices," 1 page.

Leon, et al., "Spatially Resolved Visible Luminescence of Self–Assembled Semiconductor Quantum Dots," Science, vol. 267, pp. 1986–1968, (Mar. 31, 1995).

Li, Yongxiang, et al.; "Novel Photoelectrochromic Cells Containing a Polyaniline Layer and a Dye–Sensitized Nanocrystalline $TiO_2$ Photovoltaic Cell;" *Synthetic Metals*: 1998; pp. 273–277; vol. 94; Elsevier Science B.V.

Lieber, "One–Dimensional Nanostructures: Chemistry, Physics & Applications," Solid State Communications, vol. 107, No. 11, Elsevier Science Ltd., pp. 607–616, (1998).

Liu, et al., "Strain Evolution in Coherent Ge/Si Islands," Physical Review Letters, vol. 84, No. 9, The American Physical Society, pp. 1958–1961, (Feb. 28, 2000).

Manna, Liberato, et al.; "Synthesis of Soluble and Processable Rod–, Arrow, Teardrop–, a Tetrapod–Shaped CdSe Nanocrystals;" *J. Am. Chem. Soc.*: 2000; pp. 12700–12706; vol. 122; No. 51.

Marks, R. N., et al.; "The Photovoltaic Response in Poly(p-phenylene vinylene) Thin–Film Devices;" *J. Phys.: Condens. Matter*: 1994; pp. 13797–1394; vol. 6; IOP Publishing Ltd.; United Kingdom.

Mews, et al., "Structural and Spectroscopic Investigations of CdS/HgS/CdS Quantum–Dot Quantum Wells," Physical Review B, vol. 53, No. 20, The American Physical Society, pp. R13 242–R13 245, (May 15, 1996).

Murray, et al., "Synthesis and Characterization of Nearly Monodisperse CdE (E=S, Se, Te) Semiconductor Nanocrystallites," J. Am. Chem. Soc., American Chemical Society, pp. 8706–8715, (1993).

Nazeeruddin M. K., et al.; "Conversion of Light to Electriclly by cis–$X_2Bls$(2,2'–bipyridyl–4,4'–dicarboxylate)ruthenium(II) Change–Transfer Sensitizers (X=Cl⁻, Br⁻, I⁻, CN⁻, and SCN⁻) on Nanocrystalline $TiO_2$ Electrodes;" *J. Am. Chem. Soc.*; 1993; pp. 6382–6390; vol. 115.

N1, et al., "Fabrication and Characterization of the Plate-Shaped y–Fe2O3 Nanocrystals," Chem. Mater., vol. 14, American Chemical Society, pp. 1048–1052, (2002).

O'Regan, Brian, et al.; "A Low–Cost, High–Efficiency Solar Cell Based on Dye–Sensitized Colloidal $TiO_2$ Films;" *Nature*; Oct. 24, 1991; pp. 737–740; vol. 353.

Ouali, Lahoussine, et al.; "Oligo(phenylenevinylene) Fullerene Photovoltaic Cells; Influence of Morphology**;" *Advanced Materials*; 1999.

Park, et al., "Structural and Electronic Properties of Cubic, 2H, 4H, and 6H SiC," Physical Review B, vol. 49, No. 7, The American Physical Society, pp. 4485–4493 (Feb. 15, 1994).

Park, et al., "Synthesis and Magnetic Studies of Uniform Iron Nanorods and Nanospheres," J. Am. Chem. Soc., vol. 122, American Chemical Society, pp. 8581–8582, (2000).

Park, J. Y., et al.; "The Electroluminescent and Photodiode Device Made of a Polymer Blend;" Synthetic Metals; 1996; pp. 177–181; vol. 79; Elsevier Science B.V.

Paul, "Silicon–Germanium Strained Layer Materials in Microelectronics**," Advanced Materials, vol. 11, No. 11, WILEY–VCH Verlag GmbH, pp. 191–204, (1999).

Peng, et al., Formation of High–Quality CdTe, CdSe, CdS Nanocrystals Using CdO as Precursor, J. Am. Chem. Soc., vol. 123, American Chemical Society, pp. 183–184, (2001).

Peng, et al., "Kinetics of II–VI and III–V Colloidal Semiconductor Nanocrystal Growth: "Focusing" of Size Distributions," J. Am. Chem. Soc., vol. 120, American Chemical Society, pp. 5343–5344, (1998).

Peng, et al., "Nearly Monodisperse and Shape–Controlled CdSe Nanocrystals via Alternative Routes: Nucleation and Growth," J. Am. Chem. Soc., vol. 124, American Chemical Society, pp. 3343–3353, (2002).

Peng, Xiaogang; "High Quality Inorganic Semiconductor Nanocrystals for New Solar Cells;" pp. 1–8.

Petritsch, K., et al.; "Dye–Based Donor/Acceptor Solar Cells;" Solar Energy Materials and Solar Cells; 2000; pp. 63–72; vol. 61; Elsevier Science B.V.

Qi, et al., "Reversible Micelle Based Formation of BaCO3 Nonowires," J. Phys. Chem. B, vol. 101, American Chemical Society, pp. 3460–3463, (1997).

Rees, et al., "Formation and Morphology of Calcium Sulfate Nanoparticles and Nanowires in Water–in–Oil Microemulsions," vol. 15, American Chemical Society, pp. 1993–2002, (1999).

Roman, Lucimara Stolz, et al.; "Trapping Light in Polymer Photodiodes with Soft Embossed Gratings**;" Advanced Materials: 2000; pp. 189–195; vol. 13; Issue. 3.

Roman, Lucimara, et al.; "High Quantum Efficiency Polythiophene/$C_{60}$ Photodiodes;" Advanced Materials: 1995; pp. 774–777; vol. 10; No. 10; WILEY–VCH Verlag GmbH; D–69469 Weinheim.

Roman, Lucimara, et al.; "Photodiode Performance and Nanostrusture of Polythiophene/$C_{60}$ Blends**;" Advanced Materials: 1997; pp. 1164–1168; vol. 9; No. 15; WILEY–VCH Verlag GmbH; D–69469 Weinheim.

Satoh, et al., "Epitaxial Growth of Zinc Oxide Whiskers by Chemical–Vapor Deposition under Atmospheric Pressure," Jpn. J. Appl. Phys., vol. 38, Part 2, No. 5B, Publication Board, Japanese Journal of Applied Physics, pp. L586–L589, (May 15, 1999).

Schlamp M. C., et al.; "Improved Efficiences in Light Emitting Diodes Made with CdSe(CdS) core/shell type Nanocrystals and a Semiconductor Polymer;" J. Appl. Phys.: Dec. 1, 1997; pp. 5837–5842; vol. 82; No. 11; American Institute of Physics.

Schmidt–Mende, L., et al.; "Self–Organized Discotic Liquid Crystals for High–Efficiency Organic Photovoltaics;" Reports: Apr. 17, 2001; 4 pages.

Schön, J. H., et al.; "Efficient Organic Photovoltaic Diodes Based on Doped Pentacene;" Nature; Jan. 27, 2000; pp. 406–410; vol. 403.

Shaheen, Sean, et al.; "2.5% Efficient Organic Plastic Solar Cells;" Applied Physics Letters; Feb. 5, 2001; pp. 841–843; vol. 78; No. 6; American Institute of Physics.

Sharma, Sachin Kr., et al.; "CdSe Photovoltaic Sintered Films;" Optical Materials; 1999; pp. 261–265; vol. 13; Elsevier Science B.V.

Shevchenko, et al., "Colloidal Crystals of Monodisperse FePt Nanoparticles Grown by a Three–Layer Technique of Controlled Oversaturation**," Advanced Materials, vol. 14, No. 4, WILEY–VCH Verlag GmbH, pp. 287–290, (Feb. 19, 2002).

Sirringhaus, Henning, et al.; "Integrated Optoelectronic Devices Based on Conjugated Polymers;" Science; Jun. 12, 1998; pp. 1741–1744; vol. 280.

Smalley, et al., "The Future of the Fullerenes," Solid State Communications, vol. 107, No. 11, Elsevier Science Ltd., pp. 597–606, (1998).

Smestad, Greg P., et al.; "Demonstrating Electron Transfer and Nanotechnology: A Natural Dye–Sensitized Nanocrystalline Energy Converter;" Journal of Chemical Education; Jun. 6, 1998; pp. 752–756; vol. 75.

Tada, K., et al.; "Donor Polymer (PAT6)—Acceptor Polymer (CNPPV) Fractal Network Photocells;" Synthetic Metals: 1997; pp. 1305–1306; vol. 85; Elsevier Science B.V.

Tada, Kazuye, et al.; "Characteristics of Poly(p–pyridyl vinylene) /Poly(3–alkylthiophene) Heterojunction Photocell;" Jpn. J. Appl. Phys.: Mar. 1, 1997; pp. 306–309; vol. 36 Pl. 2; No. 3A.

Tang, C. W.; "Two–Layer Organic Photovoltaic Cell;" Appl. Phys. Lett.: Jan. 13, 1986; pp. 183–185; vol. 48; No. 2; American Institute of Physics.

Tanori, et al., "Control of the Shape of Copper Metallic Particles by Using a Colloidal System as Template," Langmuir, vol. 13, American Chemical Society, pp. 639–648, (1997).

Trentler, et al., "Solution–Liquid–Solid Growth of Crystalline III–V Semiconductors: An Analogy to Vapor–Liquid–Solid Growth," Science, vol. 270, pp. 1791–1794, (Dec. 15, 1995).

Vogel, R., et al.; "Quantum–Sized PbS, CdS, $Ag_2S$, $Sb_2S_2$ and $Bi_2S_2$ Particles as Sensitizers for Various Nanoporous Wide–Bandgap Semiconductors;" J. Phys. Chem.: 1994; pp. 3183–3188; vol. 98; American Chemical Society.

Winiarz, Jeffrey, et al.; "Photogeneration, Charge Transport, and Photoconductivity of a Novel PVK/CdS–Nanocrystal Polymer Composite;" Chemical Physics; 1999; pp. 417–428; vol. 245; Elsevier Science B.V.

Yoshino, Katsumi, et al.; "Novel Photovoltaic Devices Based on Donor–Acceptor Molecular and Conducting Polymer Systems;" IEEE Transaction on Electron Devices: Aug. 8, 1997; pp. 1315–1324; vol. 44; No. 8; IEEE.

Yu, et al., "Gold Nanorods; Electrochemical Synthesis and Optical Properties," The Journal of Physical Chemistry B, vol. 101, No. 34, American Chemical Society, pp. 6661–6664, (Aug. 21, 1997).

Yu, G., et al.; "Charge Separation and Photovoltaic Conversion in Polymer Composites with Internal Donor/Acceptor Heterojunctions;" J. Appl. Phys.: Oct. 1, 1995; pp. 4510–4515; vol. 78; No. 7; American Institute of Physics.

Yu, G., et al.; "Dual–Function Semiconducting Polymer Devices: Light–emitting and Photodetecting Diodes;" Appl. Phys. Lett.: Mar. 21, 1994; vol. 64; No. 12; American Institute of Physics.

Yu, G., et al.; "Polymer Photovoltaic Cells: Enhanced Efficiencies via a Network of Internal Donor–Acceptor Heterojunctions;" *Science*; Dec. 15, 1995; pp. 1789–1791; vol. 270.

Yu, G., et al.; "Semiconducting polymer Diodes: Large Size, Low Cost Photodetectors with Excellent Visible–Ultraviolet Sensitivity;" *Appl. Phys. Lett.*: Jun. 20, 1994; pp. 3422–3423; vol. 64; No. 25; American Institute of Physics.

Zaban, A., et al.; "Photosensitization of Nanoporous $TiO_2$ Electrodes with InP Quantum Dots;" *Langmuir*: 1998; pp. 3153–3156; vol. 14; American Chemical Society.

Zhang, Fengling, et al.; "Soluble Polythiophenes With Pendant Fullerene Groups as Double Cable Materials for Photodiodes**;" *Advanced Materials*; 2001; pp. 1871–1874; vol. 13; No. 24; WILEY–VCH Verlag GmbH; D–69469 Weinheim.

Braun et al., "Semiconducting Superlattices Templated by Molecular Assemblies," *Nature*, vol. 380, pp. 325–328, 1996.

Ahmadi, et al., "Shape–Controlled Synthesis of Colloidal Platinum Nanoparticles," *Science*, vol. 272, pp. 1924–1926, (Jun. 28, 1996).

Alivisatos, "Semiconductor Clusters, Nanocrystals, and Quantum Dots," *Science*, vol. 271, pp. 933–937, (Feb. 16, 1996).

Alivisatos, et al., "Organization of Nanocrystal Molecules' using DNA," *Nature*, vol. 382, pp. 609–611, (Aug. 15, 1996).

Bandaranayake, et al., "Structural Phase Behavior in II–VI Semiconductor Nanoparticles," *Appl. Phys. Lett.*, vol. 67, No. 6, American Institute of Physics, pp. 831–833, (Aug. 7, 1995).

Bernal, et al., "X–Ray and Crystallographic Studies of Plant Virus Preparations," *The Journal of General Physiology*, vol. 25, No. 1, The Rockefeller Institute for Medical Research, pp. 111–165, (Sep. 20, 1941).

Brus, "Quantum Crystallites and Nonlinear Optics," *Applied Physics A*, vol. 53, Springer–Verlag, pp. 465–474, (1991).

Burning, et al., "Isotropic–Nematic Phase Separation of a Dispersion of Organophilic Boehmite Rods," *J. Phys. Chem.*, vol. 97, American Chemical Society, pp. 11510–11516, (1993).

Chandrasekhar, F.R.S., "Liquid Crystals", Cambridge University Press, pp. 117–121, (1992).

Li, et al., "Band Gap Variation of Size– and Shape–Controlled Colloidal CdSe Quantum Rods," *Nano Letters*, vol. 1, No. 7, American Chemical Society, pp. 349–351, (2001).

Li, et al., "Coupled Synthesis and Self–Assembly of Nonoparticles to Give Structures with Controlled Organization," *Nature*, vol. 402, Macmillan Magazines Ltd., pp. 393–395, (Nov. 25, 1999).

Li, et al., "Semiconductor Nanorod Liquid Crystals," *Nano Letters*, vol. 2, No. 6, the American Chemical Society, pp. 557–560, (Jun. 2002).

Loweth, et al., "DNA–Based Assembly of Gold Nanocrystals**," *Angew. Chem. Int. Ed.*, vol. 38, No. 12., WILEY–VCH Verlag GmbH, pp. 1808–1812, (1999).

Mirkin, et al., "A DNA–based Method for Rationally Assembling Nanoparticles into Macroscopic Materials," *Nature*, vol. 382, pp. 607–609, (Aug. 15, 1995).

Murray, et al., "Self–Organization of CdSe Nanocrystallites Into Three–Dimensional Quantum Dot Superlattices," *Science*, vol. 270, pp. 1335–1338, (Nov. 24, 1995).

Peng, et al., "Shape Control of CdSe Nanocrystals," *Nature*, vol. 404, Macmillan Magazines Ltd., pp. 59–61, (Mar. 2, 2000).

Penn, et al., "Imperfect Oriented Attachment: Dislocation Generation in Defect–Free Nanocrystals," *Science*, vol. 281, pp. 969–971, (Aug. 14, 1996).

Puntes, et al., "Colloidal Nanocrystal Shape and Size Control: The Case of Cobalt," *Science*, vol. 291, pp. 2115–2117, (Mar. 16, 2001).

Schmid, "Large Clusters and Colloids. Metals in the Embryonic State," *Chem. Rev.*, vol. 92, American Chemical Society, pp. 1709–1727, (1992).

Sonin, "Inorganic Lyotropic Liquid Crystals," *J. Mater. Chem.*, vol. 5, pp. 2557–2574, (1998).

Steigerwald, et al., "Surface Derivatization and Isolation of Semiconductor Cluster Molecules," *J. Am. Chem. Soc.*, vol. 110, American Chemical Society, pp. 3046–3050, (1988).

Strzelecka, et al., "Multiple Liquid Crystal Phases of DNA at High Concentrations," *Nature*, vol. 331, pp. 457–460, (Feb. 4, 1988).

Vroege, et al., "Phase Transitions in Lyotropic Colloidal and Polymer Liquid Crystals," *Rep. Prog. Phys.*, vol. 55, IOP Publishing Ltd., UK, pp. 1241–1309, (1992).

* cited by examiner

———— 50 nm

———— 50 nm

———— 50 nm

———— 50 nm

———— 50 nm

———— 50 nm

SEMICONDUCTOR LIQUID CRYSTAL COMPOSITION AND METHODS FOR MAKING THE SAME

CROSS-REFERENCE TO RELATED APPLICATIONS

This application claims the benefit of the filing dates of U.S. Provisional Patent Application Nos. 60/395,064, filed Jul. 12, 2002, and 60/346,253, filed Oct. 24, 2001. These patent applications are herein incorporated by reference in their entirety for all purposes.

REFERENCE TO GOVERNMENT SUPPORT

This invention was made with Government support under the U.S. Department of Energy under Contract No. DE-AC03-76SF00098 and by the Air Force Office of Scientific Research (F49620-98-1-0243). The Government has certain rights in this invention.

BACKGROUND OF THE INVENTION

Inorganic nanocrystals may be viewed as an emerging new class of macromolecules. Since methods were developed to encapsulate nanocrystals with a monolayer of protective surfactant (see M. L. Steigerwald, et al., *J. Am. Chem. Soc.* 110, 3046 (1988); G. Schmid, *Chem. Rev.* 92, 1709 (1992)), nanocrystals have been assembled as active components inside plastic electronics (see V. Colvin, M. Schlamp, A. P. Alivisatos, *Nature* 370, 354 (1994); B. O. Dabbousi, M. G. Bawendi, O. Onotsuka, M. F. Rubner, *Appl. Phys. Lett.* 66, 316 (1998); and W. U. Huynh, X. Peng, A. P. Alivisatos, *Adv. Mat.* 11, 923 (1999)), and they have been assembled into dimers, trimers (C. J. Loweth, W. B. Caldwell, X. Peng, A. P. Alivisatos, P. G. Schultz, *Angew. Chem., Int. Ed. Engl.* 38, 1808 (1999)), and crystals of nanocrystals (C. B. Murray, C. R. Kagan, M. G. Bawendi, *Science* 270, 1335 (1995); C. A. Mirkin, R. L. Letsinger, R. C. Mucic, J. J. Storhoff, *Nature* 382, 607 (1996)). In each case, the nanocrystals are treated as a conventional polymer or biological macromolecule from the assembly point of view. This enables a wide range of chemical macromolecular assembly techniques to be extended to inorganic solids, which possess a diverse range of optical, electrical, and magnetic properties (A. P. Alivisatos, *Science* 271, 933 (1996)).

One notable characteristic of some organic macromolecules is their propensity to form liquid crystalline phases when they possess a rod-like shape (J. C. Horton, A. M. Donald, A. Hill, *Nature* 346, 44 (1990); and T. E. Strzelecka, M. W. Davidson, R. L. Rill, *Nature* 331, 457 (1988)). While organic liquid crystals are widely used today, there has been a growing interest in inorganic liquid crystals. Existing inorganic liquid crystals include nanoparticles made from gibbsite ($Al(OH)_3$) and boehmite (AlO(OH)) (J.-C. P. Gabriel, P. Davidson, *Adv. Mat.* 12, 9 (2000); and A. S. Sonin, *J. Mat. Chem.* 8, 2557 (1998)).

Improvements could be made to the liquid crystal compositions described above. For example, liquid crystal compositions including gibbsite or boehmite nanoparticles have poor optical and electrical properties, and therefore, the potential application of the liquid crystal compositions with gibbsite or boehmite is very limited. It would be desirable to provide for improved inorganic liquid crystal compositions with components with interesting optical, electronic properties so that they can be used in devices. Embodiments of the invention address the above problems, individually and collectively, as well as other problems.

SUMMARY OF THE INVENTION

Embodiments of the invention include inorganic liquid crystal composition, methods for making these inorganic liquid crystal compositions, and devices comprising these liquid crystal compositions.

One embodiment of the invention is directed to a liquid crystal composition comprising: (a) a solvent; and (b) semiconductor nanoparticles in the solvent, wherein the solvent and the semiconductor nanoparticles are in an effective amount in the liquid crystal composition to form a liquid crystalline phase.

Another embodiment of the invention is directed to a liquid crystal composition comprising: (a) a solvent; and (b) semiconductor nanoparticles in the solvent, wherein each of the semiconductor nanoparticles is rod-shaped or disk-shaped, and has an aspect ratio greater than about 2:1 or less than about 1:2, and wherein the semiconductor nanoparticles in the liquid crystal composition comprise a semiconductor.

Another embodiment of the invention is directed to a method for forming a liquid crystal composition comprising: (a) forming semiconductor nanoparticles; (b) mixing the semiconductor nanoparticles and a solvent to form a mixture; and (c) forming a liquid crystal phase in the mixture.

These and other embodiments of the invention will be described in further detail below.

BRIEF DESCRIPTION OF THE DRAWINGS

FIGS. 1(*a*)–1(*c*) show nanocrystals with widths of about 3.2 nm and lengths of about 11, 20, and 40 nm, respectively. FIGS. 1(*d*)–1(*f*) show nanocrystals with widths of about 4.2 nm and lengths of about 11, 20, and 40 nm, respectively.

FIG. 2(*a*) shows droplets (tactoids) formed from the isotropic phase with the evaporation of solvent. FIG. 2(*b*) shows Schlieren textures in a later stage. The background was red due to the absorption spectra of CdSe nanocrystals. The scale bars are 20 $\mu$m.

FIG. 3(*a*) shows droplets of liquid crystalline phase mixed with isotropic phase. FIG. 3(*b*) shows an interface between a big liquid crystalline droplet (right) and an isotropic phase (left). FIGS. 3(*c*) and 3(*d*) show disclinations of strength of ½ (FIG. 3(*c*)) and 1 (FIG. 3(*d*)), respectively. The arrows point to the disclinations.

FIG. 4(*a*) shows a wide angle x-ray diffraction pattern. The vertical sharp, intense arcs correspond to the (002) planes of wurzite CdSe lattice. At about the same radius, weak arcs corresponding to the (100) and (101) planes can also be seen, but they are much more diffuse due to the small lateral dimension of these nanorods. FIG. 4(*b*) shows a small angle x-ray scattering pattern. The two diffuse arcs at Q~1.5 nm$^{-1}$ on the equator correspond to the lateral spacing between the rods in the nematic phase. The arcs corresponding to the longitudinal spacing are not resolved.

DETAILED DESCRIPTION

I. Liquid Crystal Compositions

Figure 1A:
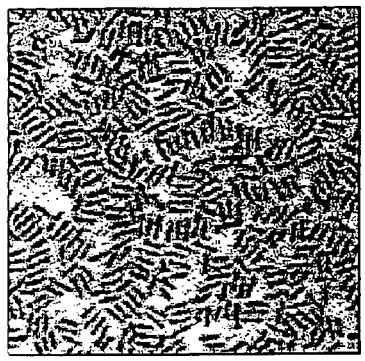
FIGS. 1(*a*)–1(*f*) show transmission electron micrographs of CdSe nanorods.
Figure 1B:
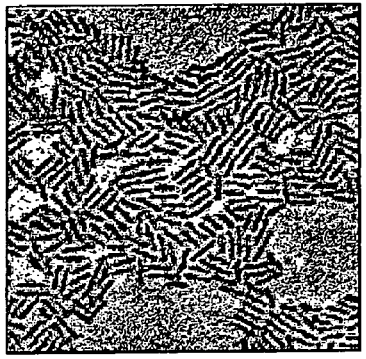
Figure 1C:
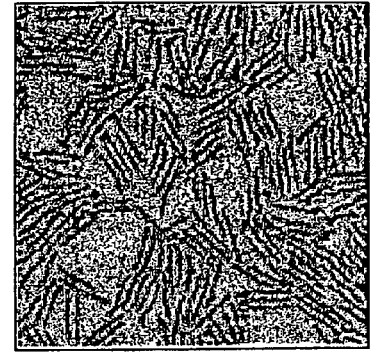
Figure 1D:
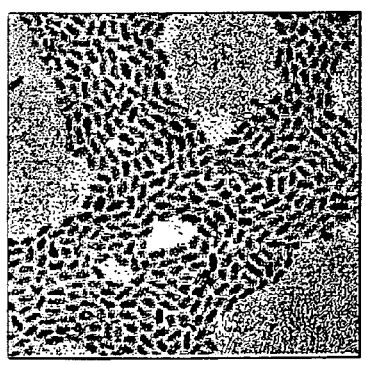
Figure 1E:
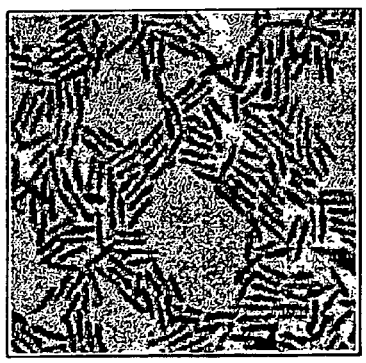
Figure 1F:
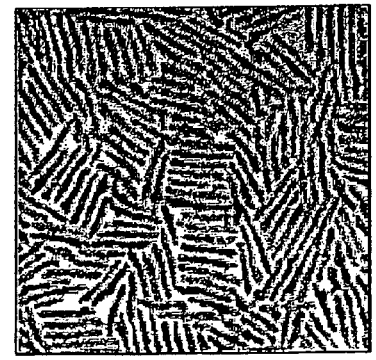

Embodiments of the invention include liquid crystal compositions having a solvent and semiconductor nanoparticles in the solvent. The solvent and the semiconductor nanoparticles are in an effective amount so that the liquid crystal composition is capable of exhibiting a liquid crystalline phase.

As used herein, a "liquid crystalline phase" includes a phase that is intermediate to a liquid phase and a crystalline phase. In a liquid crystalline phase, the orientations of substantially all nanoparticles are correlated to each other (i.e., the orientation of each individual nanoparticle is affected and is affecting the orientation of the neighboring nanoparticles), and the correlation extends to a large scale (e.g., equal to or larger than 1 micron) so that to a large scale the nanoparticles are orientated uniformly unless disrupted by a local environment such as an impurity, non-uniformity on the container wall, etc. More importantly, the orientation-correlation in the liquid crystals allows one to control the orientations of the nanoparticles with the aid of an electrical field, a magnetic field, or a pre-treated surface, so that one can switch the orientation or diminish the unwanted effect of the local environment (e.g., impurities). This is unlike an isotropic phase where the orientations of nanoparticles in solution are random.

The semiconductor nanoparticles can have any suitable form and can have any appropriate shape. For example, the semiconductor nanoparticles may be in the form of rods (e.g., uniaxial rods), disks, or ribbons. "Nanoparticles" can refer to particles that have at least one dimension less than about 100 nm whether crystalline, amorphous, or any combination thereof. "Nanocrystal particles" can refer to crystalline particles that have at least one dimension less than about 100 nm.

The semiconductor nanoparticles used in this invention generally have high aspect ratios. In some embodiments, the nanoparticles have aspect ratios greater than 1, greater than about 2, or greater than about 4. In some specific embodiments, the aspect ratios of the semiconductor nanoparticles can vary from about 1 to about 100. They can have widths from about 1 to about 100 nm, and lengths from about 1 nm to about 100 microns. In some embodiments, at least about 50% or at least about 80% of the nanoparticles in the composition can have one or more such characteristics.

The distribution of the semiconductor nanoparticles may be narrow. For example, the distribution of the semiconductor nanoparticles in the liquid crystal composition can be about 5%, 10%, or 20% for the particle widths and about 5%, 10%, 20%, or 30% for the particle lengths. A 5% width distribution generally means that 68% of the rods have diameters between 95% and 105% of the mean width value. A 10% length distribution means that 68% of the rods have diameters between 90% and 110% of the mean width value.

The optical properties of the semiconductor nanoparticles can depend upon their diameters and lengths (see L.-S. Li, J. Hu, W. Yang, A. P. Alivistaos, *Nano Lett.* 1, 349 (2001)). The photoluminescence wavelengths produced by the semiconductor nanoparticles can be tuned over the visible range by variation of the particle size, and the degree of polarization can be controlled by variation of the aspect ratio. Accordingly, by tuning the size of the semiconductor nanoparticles, the liquid crystal compositions may emit different colors (i.e., different wavelengths of light). For instance, when the semiconductor nanoparticles in the liquid crystal composition are about 3 nanometers wide and are about 5 nanometers long, the liquid crystal composition can produce green light. When the semiconductor nanoparticles in the liquid crystal composition are about 3 nanometers wide and are about 60 nanometers long, the liquid crystal composition can produce orange light. When the semiconductor nanoparticles in the liquid crystal composition are about 4 nanometers wide and about 6 nanometers long, the liquid crystal composition can produce red light. Accordingly, in embodiments of the invention, the optical properties of the liquid crystal composition can be "tuned" by adjusting the size of the nanoparticles in the liquid crystal composition. Also, because the semiconductor nanoparticles are aligned in embodiments of the invention, any light that is produced by the aligned semiconductor nanoparticles can be polarized. Accordingly, embodiments of the invention can be used as polarized light sources.

The semiconductor nanoparticles may comprise any suitable semiconductor material. For example, suitable semiconductors include compound semiconductors. Suitable compound semiconductors include Group II-VI semiconducting compounds such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. Other suitable compound semiconductors include Group III-V semiconductors such as GaAs, GaP, GaAs-P, GaSb, InAs, InP, InSb, AlAs, AlP, and AlSb. The use of Group IV semiconductors such as germanium or silicon may also be feasible under certain conditions.

Any suitable solvent can be used in the liquid crystal composition. The solvent may comprise an organic solvent. For example, the solvent may include saturated or unsaturated cyclic (or linear) hydrocarbons alone, or in combination with other molecules. Preferably, the solvent comprises at least one of hexanes, benzene, toluene, cyclohexane, octane or decane. Other examples of suitable solvents include chloroform or tri-butyl phosphine, tri-octyl phosphine, any alkyl phosphine, or any mixture of alkyl chains with the functional groups listed above. The solvent can be polar, non-polar, amphiphilic, amphiphobic, hydrophobic, hydrophilic, lyotropic, surfactant-based, etc.

Other solvents may be used in other embodiments of the invention. For example, if a surfactant is used and the semiconductor nanoparticles are coated (e.g., with a silica shell), then a polar solvent such as water, acetone, and alcohols may be used.

The semiconductor nanoparticles can be combined with an effective amount of the solvent to form a liquid crystal composition with a liquid crystalline phase. In some embodiments, the following equation can be used as a guide for determining the approximate volume of solvent to use with a given volume of semiconductor nanoparticles:

$$\frac{4}{AR} \cong \frac{V_{NC}}{V_{SOLUTION}}$$

AR is the average aspect ratio of the semiconductor nanoparticles, while $V_{NC}$ is the volume of semiconductor nanoparticles, and $V_{SOLUTION}$ is the volume of the solution. See generally, L. Onsager, *Ann. [N. Y.] Acad. Sci.* (1949) Vol. 51, p. 627. Of course, the volume ratio of the semiconductor nanoparticles to the solution can be less than or greater than this. The volume ratio of the semiconductor nanoparticles to solution may depend on the size and shapes of the nanoparticles used, as well as the particular properties of the solvent used. In some embodiments, the specific proportions of semiconductor nanoparticles and solvent can be empirically determined.

In some embodiments, the semiconductor nanoparticles may be coated with amphiphilic molecules. For example, CdSe nanocrystal rods (or other semiconductor nanoparticles) can be coated with organic molecules such as alkyl phosphine, alkyl phosphine oxides, and alkyl phosphonic acids. Such molecules keep the nanoparticles well-separated and dispersible in organic solvents. The coated semiconductor nanoparticles could be the as-made product of semiconductor precursors in a surfactant mixture. Processes that use a surfactant mixture to form semiconductor nanoparticles are described below.

In other embodiments, the semiconductor nanoparticles need not be coated with amphiphilic molecules. For example, in some embodiments, semiconductor nanoparticles with or without amphiphilic molecules can be added to a solvent along with a separate surfactant (or combination of surfactants).

Having amphiphilic molecules bound to the surfaces of the nanoparticles is one way to disperse them in a liquid medium comprising, for example, a nonpolar solvent. It is also possible to treat the surfaces of the nanoparticles with, e.g., alkylamines, alkylthiols, carboxylic acid functional groups, etc. If desired, a polyelectrolyte material or an oxide material such as silica could be used to coat the semiconductor nanoparticles to make them soluble in water.

II. Methods for Forming Liquid Crystal Compositions

The liquid crystal compositions according to embodiments of the invention can be made in any suitable manner. The semiconductor nanoparticles are first synthesized. The synthesized semiconductor nanoparticles can then be mixed with a solvent to form a mixture. A liquid crystalline phase can then be made from the mixture. These steps are described in detail below.

A. Forming Semiconductor Nanoparticles

The semiconductor nanoparticles can be made in any suitable manner. Suitable processes for forming high-aspect ratio semiconductor nanoparticles can be found in, for example, J. Hu, L.-S. Li, W. Yang, L. Manna, L.-W. Wang, A. P. Alivisatos, *Science* 292, 2060 (2001), and U.S. Pat. Nos. 6,225,198 and 6,306,736. All of these references are herein incorporated by reference in their entirety for all purposes.

The process for forming anisotropically shaped compound semiconductor nanocrystals can comprise mixing a solution of semiconductor nanocrystal precursors with a surfactant mixture capable of promoting the growth of high-aspect ratio semiconductor nanoparticles (e.g., rod-like or disk-like nanocrystal nanoparticles). As explained in U.S. Pat. Nos. 6,225,198 and 6,306,736, the shapes of the semiconductor nanocrystal nanoparticles can be controlled by adjusting the ratio of the surfactants used to make them.

In some embodiments, the precursors used to synthesize the shaped semiconductor nanocrystals include Group II, III, V, and/or VI precursors. For example, in embodiments of the invention, semiconductor nanoparticles including a Group II–VI compound semiconductor can be the reaction product of at least one precursor containing a Group II metal containing precursor and at least one precursor containing a Group VI element, or a precursor containing both a Group II and a Group VI element. In other embodiments of the invention, semiconductor nanoparticles including a Group III–V compound semiconductor can be the reaction product of at least one precursor containing a Group III element and at least one precursor containing a Group V element, or a precursor containing both a Group III and a Group V element.

If Group III–V semiconductor nanoparticles are to be synthesized, a Group III precursor, such as a GaIII salt, InIII salt, or AlIII salt (e.g. of a halide, or corresponding metal 1–6 carbon trialkyls) can be reacted directly with an arsenic, phosphorus, or antimony source such as arsine, phosphine, or stibine; an alkyl arsine, phosphine or stibine; or an alkyl silyl arsine, phosphine or stibine in liquid phase at an elevated temperature. Representative metal sources include $GaCl_3$, $GaBr_3$, $GaI_3$, $InCl_3$, $InBr_3$, $AlCl_3$, $Ga(Me)_3$, $Ga(Et)_3$, $Ga(Bu)_3$, or the like. Representative arsenic, phosphorus and selenium sources include $AsH_3$, $PH_3$, $SeH_3$, $AsH_2$ (1–6 carbon alkyl), $As(1–4\ carbon\ alkyl)_3$, $P(1–4\ carbon\ alkyl)_3$, $As(Si(1–6\ carbonalkyl)_3)_3$, $P(Si(1–6\ carbon\ alkyl)_3)_3$, $Se(Si(1–4\ carbon\ alkyl)_3)_3$ and the like If Group II–VI semiconductor nanoparticles are to be synthesized, they may be the reaction product containing at least one precursor comprising a Group II element such as Zn, Cd, or Hg, and at least one precursor comprising a Group VI element such as O, S, Se, or Te, or a precursor containing both a Group II element (Zn, Cd, or Hg) and a Group VI element (S, Se, or Te). Those of skill in the art can select the appropriate precursors to form the appropriate compound semiconductor. For example, $Cd(CH_3)$ and Se are examples of precursors respectively containing Group II and Group VI elements that can be used to form CdSe nanoparticles.

Embodiments of the invention preferably use a surfactant mixture to make the semiconductor nanoparticles. The surfactant mixture can be a high boiling point liquid mixture of two or more non-reactive organic surfactants. The mixture of non-reactive organic surfactants is capable of promoting the growth of high-aspect ratio semiconductor nanoparticles.

The surfactant mixture can have a boiling point that is high enough so that a reaction between the Group II and Group VI precursors, or the Group III and Group V precursors, can take place to form the desired semiconductor nanocrystals. For example, in some embodiments, the surfactant mixture can have a boiling point between about 200° C. to about 400° C.

The surfactant mixture may include any suitable number of different surfactants. For example, the surfactant mixture may include a first organic surfactant, a second organic surfactant, and an optional third organic surfactant. As noted above, the surfactant mixture can be capable of being heated to a crystal-growing temperature, and can promote the growth of high-aspect ratio semiconductor nanocrystals.

The first surfactant in the surfactant mixture may comprise a phosphorus-containing surfactant capable of withstanding such crystal-growing temperatures. Examples of such first phosphorus-containing liquid surfactants include liquid surfactants such as 3–18 carbon trialkyl phosphines (e.g., tributyl phosphine), or 3–18 carbon trialkyl phosphine oxides (e.g., trioctyl phosphine oxide or "TOPO").

The surfactant mixture can include a second organic surfactant. The second organic surfactant may be capable of being heated to crystal-growing temperatures and may be capable of promoting the growth of high-aspect ratio semiconductor nanoparticles. Preferably, the second liquid surfactant capable of promoting the growth of rod-like shaped semiconductor nanoparticles can comprise a phosphorus-containing surfactant capable of withstanding such crystal-growing temperatures.

The second organic surfactant may comprise an organic-substituted acid, or acid salt surfactant containing phosphorus such as, for example, phosphonic and phosphinic acids. Suitable phosphinic acids may include mono and diphosphinic acids having the general formula $R'R_xH_{(1-x)}POOH$, where R and R' are the same or different 3–18 carbon (but preferably 6–10 carbon) organic groups such as alkyl or aryl groups, and x is 0–1. In some embodiments, the second organic surfactant comprises a 6–10 carbon alkyl phosphonic acid, e.g., hexyl phosphonic acid. The purity of the second organic surfactant in the surfactant mixture can be at least 95 wt. %.

An optional third surfactant can be optionally added to the surfactant mixture. For example, a third surfactant including tetradecyl phosphonic acid can be used in the surfactant mixture along with a first and a second surfactant (e.g., TOPO and hexyl phosphonic acid). As an alternative to tetradecyl phosphonic acid, other alkyl phosphonic acids could be used.

While not intending to be bound by theory as to how the surfactants operate in the reaction to control both the size and shape of the semiconductor nanocrystals, it is believed that one or more of the surfactants in the surfactant mixture binds or associates with one or more of the precursors to slow the initial growth of the semiconductor crystal, thus resulting in the formation or growth of the desired nanoparticles, rather than macro crystals. It is also believed that the second surfactant (and possibly the third surfactant if present) in the mixture further binds to certain faces of the growing crystallites, depending upon the concentration of the second surfactant in the surfactant mixture, to control the shape of the growing crystallite as well.

With the above in mind, the presence of greater than a certain weight percentage of the second surfactant in a surfactant mixture results in the formation and growth of high-aspect ratio semiconductor nanoparticles (e.g., nanorods). Thus, for example, when tri-octyl phosphine oxide (TOPO) is used as the surfactant in the surfactant mixture as a first surfactant and hexyl phosphonic acid is used as the second surfactant, concentrations of 5 wt. % (10.91 molar %), 10 wt. % (20.54 molar %), and 20 wt. % (37 molar %) hexyl phosphinic acid in the surfactant mixture, with the balance comprising TOPO, reproducibly produces rod-like shaped semiconductor nanocrystals.

Thus, to grow nanocrystals having two axes of very small dimension, with an enlarged third dimension, i.e., a rod of very small cross sectional area, larger concentrations of the second surfactant can be used in the surfactant mixture. Exact concentrations of the surfactants needed to form high-aspect ratio semiconductor nanocrystal nanoparticles can depend upon the particular first and second surfactants (and the third surfactant if present) used and the particular precursors being used. Concentrations of surfactants can be empirically determined for each mixture of surfactants.

During the initial introduction of the dissolved precursors, the solution of precursors can be injected into a boiling surfactant mixture, while the surfactant mixture is maintained at a first temperature, which results in the instantaneous nucleation of seed crystals. This temperature, for example, when cadmium selenide (CdSe) nanocrystals are being formed in a surfactant mixture of TOPO and hexyl phosphonic acid, may be about 360° C. While initiation of the crystal growth at this higher first temperature is preferable to the preferential growth of nanocrystals of the precursors rather than macro crystals, it is equally preferable that the continued nucleation of such seed crystals be arrested in favor of growth of the already formed seed crystals.

The solution of precursors can be injected, preferably as a cold solution, e.g., at room temperature, so that immediately after the injection the temperature of the high boiling mixture of surfactants drops to a second temperature of lower value which is kept constant during the nanocrystal growth. This temperature, for example, when cadmium selenide (CdSe) semiconductor nanocrystals are formed in a solution of TOPO and hexyl phosphonic acid, may range from about 250° C. to about 300° C. if the initial temperature ranges from 280° C. to 360° C.

Subsequent nanocrystal growth is then stopped by a further reduction of the temperature to below the temperature at which nanocrystal growth occurs. Since this temperature may vary from precursor to precursor, and precise control of the time period for crystal growth is desirable, cessation of the crystal growth may be conveniently accomplished by rapidly reducing the temperature to ambient temperature or even lower, e.g., down to about 25° C. or lower, e.g., by removing the heating mantle, that was used as a heat source. The temperature can be reduced more rapidly if the solution is cooled with a stream of air.

The precursors may be dissolved in any organic liquid compatible with the surfactant mixture. Examples of organic liquids include polar organic solvents including trialkyl phosphine, e.g., tributyl phosphine. In some embodiments, the precursors may be dissolved in the same solvent or may be dissolved separately to form two solutions.

The solution or solutions containing the dissolved precursors can be maintained at a temperature below crystal growth temperature (conveniently at ambient temperature or lower), while the surfactant mixture is heated to the first (nucleation) temperature. The solution (or solutions) containing the precursors is then injected into the surfactant mixture at a high rate of speed, for example, through a needle or a pressurized nozzle, to rapidly heat the precursors up to the first nucleation temperature. The concentration of the precursors in the boiling liquid medium can initially be about 0.18 M at the time of initial injection of the precursor solution into the liquid medium.

Although injecting a solution including a combination of precursors into a heated surfactant mixture is described, it is understood that the different precursors could be in their own separate solutions and these different solutions could be separately injected into the heated surfactant mixture in other embodiments of the invention. For example, if CdSe nanoparticles are to be formed, a Cd precursor solution and a Se precursor solution can be separately and sequentially injected into a hot surfactant mixture to produce CdSe nanorods.

The time of the reaction to grow the semiconductor nanocrystals can vary with the type of semiconductor precursors used, the composition and temperature of the mixture of surfactants constituting the liquid media in which the crystals are growing, and the concentration of the precursors in the surfactant mixture, as well as the desired aspect ratios of the semiconductor nanocrystals. For example, for the growth of CdSe semiconductor nanorods having an average length of 15 nm, and an aspect ratio of 5, in a liquid medium maintained at a temperature of about 300° C., and at a precursor concentration of 0.18 M, the desired semiconductor nanocrystals may be grown in a period of from about 300 seconds to about 600 seconds.

After they are formed, the semiconductor nanoparticles are separated from the liquid medium that is used to form them. In some embodiments, a solvent such as methanol or acetone is added to the liquid medium containing the semiconductor nanoparticles to precipitate them. For example, CdSe nanorods are generally not soluble in polar solvents such as methanol or acetone. Any appropriate solvent can be added to precipitate semiconductor nanoparticles from the solution.

After the semiconductor nanoparticles have precipitated, the precipitated nanoparticles are separated from the rest of the solution. In some embodiments, centrifuging can be used to separate the semiconductor nanoparticles from other solution components. After centrifuging, the supernatant can be separated from the nanoparticles. The nanoparticles can then be stored as precipitate or can be dried in a vacuum.

After the nanoparticles are separated from the liquid medium that is used to make them, an appropriate solvent or a mixture of several different solvents for the liquid crystal composition is selected. The solvent may include saturated or unsaturated cyclic hydrocarbons alone, or in combination with other molecules. Preferably, hydrocarbons such as hexanes, toluene, cyclohexane, octane or decane could be used. The semiconductor nanoparticles can be combined with a solvent to form a liquid crystal composition.

The appropriate solvent to semiconductor nanoparticle volume ratio may be achieved in any suitable manner. For example, the solvent may be added to the nanoparticles until the appropriate solvent concentration is achieved. In other embodiments, a solution comprising the nanoparticles and the solvent may be produced, and the amount of solvent in the solution may be reduced until the concentration of nanoparticles is sufficient to form a liquid crystal composition with a liquid crystalline phase. For example, blowing or heating could be used to remove solvent from a composition including semiconductor nanoparticles and the solvent to form a liquid crystalline composition with a liquid crystal phase.

The nanoparticles can be controlled with external aids. Alignment aids can include aids that can produce an electrical, or magnetic field that can be used to align the semiconductor nanoparticles. In yet other embodiments, it is possible to align the semiconductor nanocrystal nanoparticles in the liquid crystal composition by contacting the liquid crystal composition with a pretreated surface that automatically aligns the nanocrystal nanoparticles. Such pretreated surfaces and alignment methods are known to those of ordinary skill in the art of the organic liquid crystal devices.

Embodiments of the invention can be used in any number of suitable end applications including liquid crystal displays, light emitting diodes (e.g., polarized light emitting diodes), photovoltaic devices or solar cells. They can also be used as optical devices for producing image converters, electrooptical or magnetooptical switches, spectacle lenses, or other variable transmission objects, etc. The liquid crystal compositions could also be used in polarizing light sources, because the semiconductor nanocrystals can be aligned. The electronic components of devices such liquid crystal displays, light emitting diodes, etc. are known in the art and need not be described in detail here.

EXAMPLES

CdSe nanorods were formed, because they could be synthesized in large quantity (~100 mg) with variable aspect ratios and with excellent monodispersity (Hu, L.-S. Li, W. Yang, L. Manna, L. W. Wang, A. P. Alivisatos, *Science* 292, 2060 (2001)). The CdSe nanorods were made by pyrolysis of organometallic precursors of Cd and Se in a hot surfactant mixture. By varying the composition of the surfactant, CdSe nanocrystals were synthesized with variable widths and lengths. The specific procedures in J. Hu, L.-S. Li, W. Yang, L. Manna, L. W. Wang, A. P. Alivisatos, *Science* 292, 2060 (2001) were used to form the CdSe nanocrystals.

The aspect ratios of the formed nanoparticles varied from 1 to 15. The widths varied from 3 to 7 nm, and lengths varied from 3 to 70 nm. The distribution was 5% for width and 10% for length. As noted above, a 5% width distribution generally means that 68% of the rods have diameters between 95% and 105% of the mean width value. A 10% length distribution means that 68% of the rods have diameters between 90% and 110% of the mean width value.

After they were formed, the CdSe nanorods were separated from the solvent that was used to form them. A liquid was then added to the solution containing the nanorods to precipitate them. After the nanorods precipitated, the precipitated nanorods were separated from the rest of the solution by centrifuging. After centrifuging, the supernatant was separated from the nanorods.

The CdSe nanorods were combined with cyclohexane to form the liquid crystal composition. In this example, the CdSe nanorods were combined with cyclohexane so that the weight percent of cyclohexane was 10% by weight of the composition.

The transmission electron micrographs of samples are shown in FIG. 1. These micrographs illustrate the range and quality of the nanorods produced. The CdSe nanorods were functionalized with amphiphilic molecules, such that polar functional groups were bound to the nanocrystal surfaces, and long alkyl chains projected outward. The alkyl chains provided the nanorods with high solubility in an organic solvent.

The formation of liquid crystalline phases of the CdSe nanorods was verified by examining birefringence in solutions of nanorods in an optical microscope with crossed polarizers. The solution of CdSe nanorods (in cyclohexane, 10% wt.) with a length of 40.0 nm and a width of 4.0 nm was sealed in a capillary tube. The solution itself was isotropic at such a low concentration. When it was mounted on the microscope, the heating caused by the incident light slowly evaporates the solvent at the focusing spot, causing the solution to become more concentrated, leading to the formation of a birefringent liquid crystalline phase. The anisotropic refractive index of the liquid crystalline phase alters the polarization of transmitted light, leading to light and dark patterns on the micron scale. Because the capillary tube was sealed and the light only changes the distribution of solvent within the tube, the local concentration of the solution could be changed by varying the intensity of incident light. The speed of evaporation could be controlled and it was possible to monitor the evolution of the liquid crystalline phase reversibly.

Figure 2A:
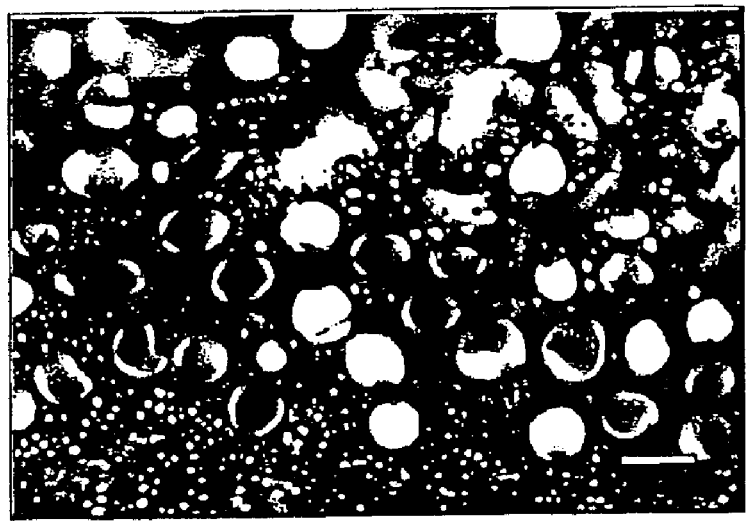
FIGS. 2(*a*)–2(*b*) show birefringence observed under a polarizing optical microscope during evaporation of solvent.
Figure 2B:

FIGS. 2(a) and 2(b) show the birefringent pattern observed at two different stages. Isotropic liquids show complete extinction, and no pattern is observed from concentrated solutions of mixtures of the surfactants used in the synthesis of these nanorods. The intensity of the transmitted light reveals the orientation of the nanorods.

FIG. 2(a) shows the nucleation of the liquid crystalline phase. Small (~2 μm) and large (~10–20 μm) birefringent droplets (tactoids) emerge from an isotropic solution as the concentration increases. The solution was colored red, because of the band gap of the CdSe nanocrystals. As they have higher optical density than the isotropic medium, the present inventors concluded that these droplets have higher concentrations of nanorods. The variations in the intensity of the transmitted light through the droplets indicate alignment of the rods within each droplet. The patterns are generally dipolar, but some higher modes have been observed as well. The slightly elongated non-spherical shape of the droplets provided another clear indication that the nanorods were oriented within each droplet. This distortion is due to the balance between surface tension and anisotropic elasticity (J. D. Bernal, I. Frankuchen, *J. Gen. Physiol.* 25, 111 (1941)), in which the former favors a spherical surface while the latter favors a cylindrical uniaxial surface. This effect is more obvious in smaller droplets than in bigger ones.

Once the liquid crystalline phases had fully developed, a new set of patterns was observed. FIG. 2(b) shows the Schlieren structures formed at a later stage. Dark threadlike brushes are observed sticking out from some singular points. The singular points (disclinations) were identified as the positions where the alignment direction of nanoparticles is not well defined. The dark brushes were due to the nanoparticles with alignment parallel to either of the polarizers. When the sample was rotated, these singular points remained fixed, but the dark brushes moved around them. When one end of the capillary tube was lifted, the patterns flowed and deformed easily, suggesting the fluidity of the birefringent phase. Similar observations were also reported in colloidal boehmite rod suspensions (P. A. Buining, H. N. W. Lekkerkerker, *J. Phys. Chem.* 97, 11510 (1993)).

Figure 3B:
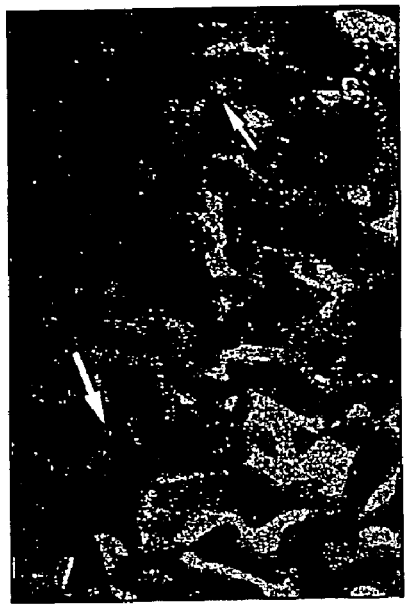
FIGS. 3(*a*)–3(*d*) show images of liquid crystalline phases in a concentrated solution of CdSe nanocrystals under a polarizing optical microscope. Isotropic phases appear dark in these images. All the bright areas in the image correspond to the liquid crystalline phase, with dark lines corresponding to disclinations or the area where the orientation of the nanorods are parallel to either of the polarizers.

To demonstrate that it was possible to form a stable liquid crystalline phase in CdSe nanorod solutions, nanorods with a diameter of 3.8 nm and length of 49.0 nm were dissolved in excess of anhydrous cyclohexane. Some solvent was blown away with nitrogen. FIGS. 3(a)–3(d) show some images taken under a polarizing optical microscope from a solution with CdSe nanorods ~88% by weight (~50% v./v.). FIG. 3(a) shows the solution as a mixture of liquid crystalline droplets and an isotropic phase one day after homogenization. Although a complete phase separation could have taken months, two weeks later large domains of liquid crystalline phase could be seen by eye. FIG. 3(b) shows an image of the interface between the liquid crystalline phase and the isotropic phase obtained after the droplets have grown and coalesced. Schlieren structure can also be seen. When the solution is diluted to ~80% (~38% v./v.), the liquid crystalline domains disappear, and the solution becomes isotropic. Shaking the solution causes flow birefringence, which slowly vanishes when at rest. This concentration is higher than the critical concentration expected from numerical study (S-D. Lee, *J. Chem. Phys.* 87, 4972 (1987)) performed on hard spherocylinders, even when the change of effective volume caused by the surface capping ligands is considered (Assume the surface molecules increase both diameter and length by 1.1 nm. A critical concentration of 27% v./v. is given for hard rods with an aspect ratio of 10) (see S-D. Lee, *J. Chem. Phys.* 87, 4972 (1987)).

Figure 3D:
Figure 3A:
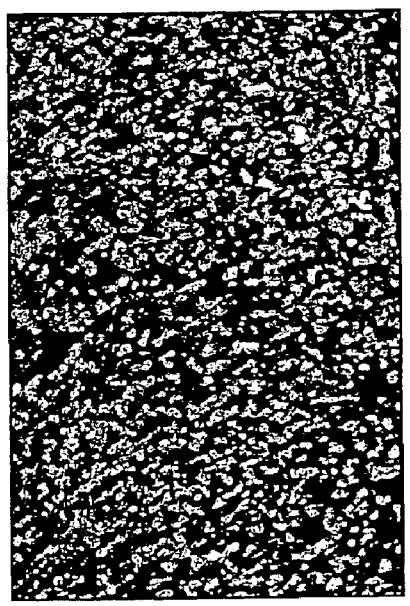
Figure 3C:

FIGS. 3(c) and 3(d) show some defects observed with Schlieren structures characteristic of a nematic phase. FIG. 3(c) shows disclinations with a strength of ½. The strength of a disclination is defined to be a quarter of the number of dark brushes sticking out of it. In FIG. 3(d), disclinations with strength of about 1 can be seen. The disclinations with strength of about 1 are observed less often than those with strength of ½, and sometimes even slight heating by light can anneal them out. Because the formation of disclinations in liquid crystalline phases costs elastic energy (S. Chandrasekhar, *Liquid Crystals* (the University Press, Cambridge, 1992)), and the energy involved increases with strength, the inventors concluded that the CdSe nanorods in the liquid crystalline phase have much higher elastic constants as compared to regular organic liquid crystal molecules, as expected from the high rigidity and the large size of the CdSe nanorods.

The anisotropy of intermolecular interactions plays an important role in the formation of liquid crystals. The orientation of liquid crystals is sensitive to external field, flow and pretreated surface (S. Chandrasekhar, *Liquid Crystals,* the University Press, Cambridge, 1992), and therefore liquid crystalline phases of CdSe nanorods provide a way to align and manipulate their orientation on a large scale. Because they have tunable and linearly polarized photoluminescence as well as anisotropic nonlinear optical properties (L. Brus, *Appl. Phys.* A 53, 465 (1991)), liquid crystals of CdSe nanorods can be used as functional components in electro-optical devices such as polarized light emitting diodes, flat panel displays and electro-optic modulators.

Figure 4A:
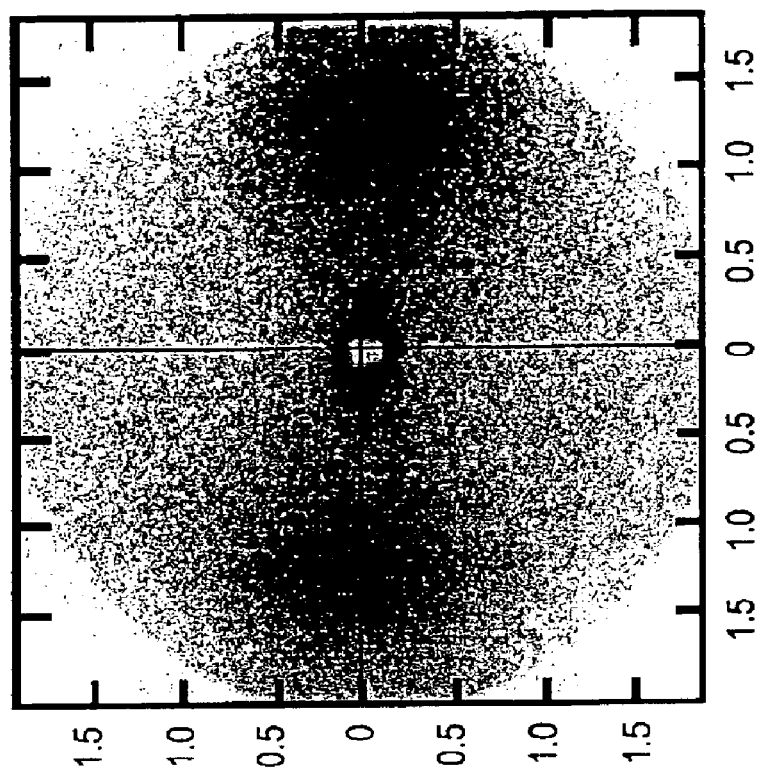
FIGS. 4(*a*)–4(*b*) respectively show wide angle x-ray diffraction and small angle x-ray scattering of the same nematic solution of CdSe nanorods in a 300 $\mu$m thick capillary tube. They show the preferential alignment of these nanorods along the axis of the capillary tube. In both measurements, the capillary tube is held vertically.
Figure 4B:
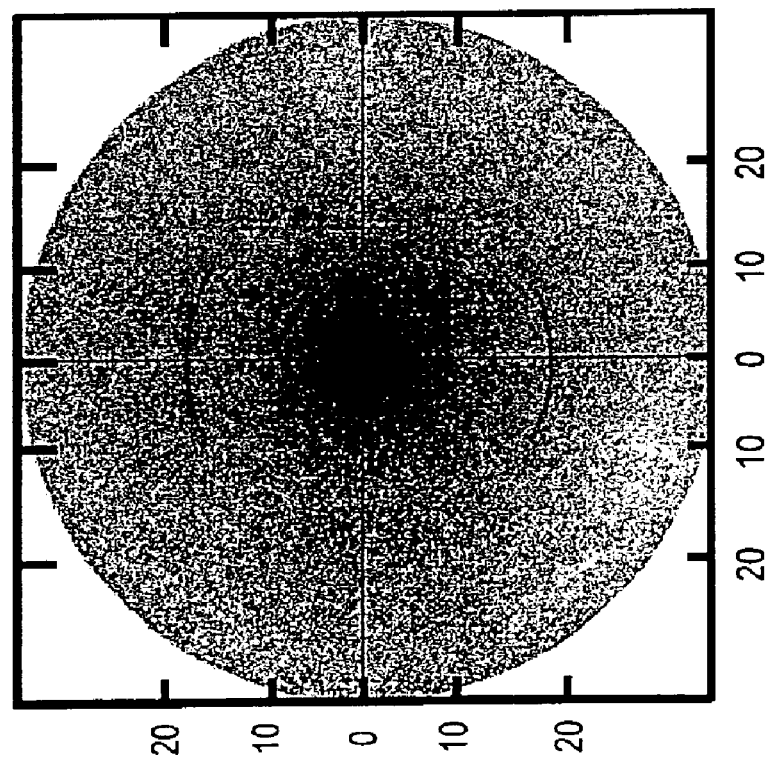

In the liquid crystalline phase, the nanorods exhibit cooperative phenomena that extend the available methods for aligning the nanorods, for instance, using external magnetic or electric fields, or by interaction with a surface. To demonstrate the liquid crystalline character of these solutions, a combination of wide and small angle X-ray diffraction techniques was used. FIGS. 4(a) and 4(b) respectively show the wide-angle x-ray diffraction (FIG. 4(a)) and small angle X-ray scattering patterns (FIG. 4(b)) from a nematic solution in a 300-micron thick capillary tube. These rods have a length of ~60 nm and width of 3.0 nm. In both FIGS. 4(a) and 4(b), the capillary tube remained vertical. In FIG. 4(a), the sharp arcs in the vertical position are due to (002) planes of the CdSe crystalline lattice within individual nanorods. The high intensity and sharpness of the arcs are determined by the elongated shape of the CdSe nanorods. The anisotropy of the pattern demonstrates macroscopic alignment of the long axis of the rods. Consistently, in FIG. 4(b), the diffuse arcs in the equator direction correspond to the lateral distance of the nanorods, suggesting the short axis is aligned as well. Together, the patterns demonstrate the preferential alignment of the CdSe nanorods along the capillary tube axis direction, which is attributed to the curved surface of the capillary tube. It can be estimated that about 70% of the nanorods are oriented within 20° from the axis of the capillary tube.

All patents, patent applications, and publications mentioned above are herein incorporated by reference in their entirety for all purposes.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A liquid crystal composition comprising:

(a) a solvent; and (b) semiconductor nanoparticles in the solvent, wherein the solvent and the semiconductor nanoparticles are in an effective amount in the liquid crystal composition to form a liquid crystalline phase, wherein the semiconductor nanoparticles comprise rod-shaped nanoparticles.

2. A liquid crystal composition comprising:

(a) a solvent; and (b) semiconductor nanoparticles in the solvent, wherein the solvent and the semiconductor nanoparticles are in an effective amount in the liquid crystal composition to form a liquid crystalline phase, wherein the semiconductor nanoparticles have aspect ratios greater than about 2.

3. The liquid crystal composition of claim 1 wherein the semiconductor nanoparticles comprise a Group III–V compound semiconductor.

4. The liquid crystal composition of claim 1 wherein the semiconductor nanoparticles comprise a Group II–VI compound semiconductor.

5. The liquid crystal composition of claim 1 wherein the solvent comprises an organic solvent.

6. The liquid crystal composition of claim 1 further comprising amphiphilic molecules, wherein the semiconductor nanoparticles are attached to the amphiphilic molecules.

7. A liquid crystal composition comprising:
(a) a solvent; and
(b) semiconductor nanoparticles in the solvent,
wherein the solvent and the semiconductor nanoparticles are in an effective amount in the liquid crystal composition to form a liquid crystalline phase,
wherein each of the semiconductor nanoparticles has an aspect ratio of greater than 1.

8. The liquid crystal composition of claim 1 wherein each of the semiconductor nanoparticles comprise a compound semiconductor.

9. The liquid crystal composition of claim 1 wherein the semiconductor nanoparticles comprise CdSe.

10. A device comprising a liquid crystal composition, wherein the liquid crystal composition comprises (a) a solvent; and (b) semiconductor nanoparticles in the solvent, wherein the solvent and the semiconductor nanoparticles are in an effective amount in the liquid crystal composition to form a liquid crystalline phase.

11. The device of claim 10 wherein the device is a polarized light emitting diode, or a solar cell.

12. A liquid crystal display comprising a liquid crystal composition, wherein the liquid crystal composition comprises (a) a solvent; and (b) semiconductor nanoparticles in the solvent, wherein the solvent and the semiconductor nanoparticles are in an effective amount in the liquid crystal composition to form a liquid crystalline phase.

13. A liquid crystal composition comprising:
(a) a solvent; and
(b) semiconductor nanoparticles in the solvent,
wherein each of the semiconductor nanoparticles is rod-shaped or disk-shaped, and has an aspect ratio greater than about 2:1 or less than 1:2, and wherein the semiconductor nanoparticles in the liquid crystal composition comprise a semiconductor.

14. The liquid crystal composition of claim 13 wherein the solvent is a non-polar solvent.

15. The liquid crystal composition of claim 13 wherein the semiconductor nanoparticles are rod shaped.

16. A device comprising the liquid crystal composition of claim 13.

17. The device of claim 16 wherein the device is a polarized light emitting diode, or a solar cell.

18. A liquid crystal display comprising the liquid crystal composition of claim 13.

19. A method for forming a liquid crystal composition comprising:
(a) forming semiconductor nanoparticles;
(b) mixing the semiconductor nanoparticles and a solvent to form a mixture; and
(c) forming a liquid crystal phase in the mixture.

20. The method of claim 19 wherein the semiconductor nanoparticles are rod-shaped.

21. The method of claim 19 wherein forming the semiconductor nanoparticles comprises:
introducing compound semiconductor precursors into a heated solution containing at least two different surfactants.

22. The method of claim 19 wherein forming the semiconductor nanoparticles comprises:
introducing compound semiconductor precursors into a heated solution containing at least two different surfactants, wherein the compound semiconductor precursors include a Group II–VI element, a Group III–V element, or a Group IV element.

23. The method of claim 19 wherein the semiconductor nanoparticles comprise semiconductors.

24. The method of claim 19 wherein mixing the semiconductor nanoparticles and the solvent comprises:
adding the semiconductor nanoparticles to the solvent.

25. The method of claim 19 wherein forming the liquid crystal phase from the mixture includes:
adjusting the amount of solvent in the mixture to form the liquid crystal phase.

26. The method of claim 19 wherein the solvent is a non-polar solvent.

27. The liquid crystal composition of claim 1 wherein the semiconductor nanoparticles comprise a Group IV semiconductor.

28. A liquid crystal composition comprising:
(a) a solvent; and
(b) semiconductor nanoparticles in the solvent,
wherein the solvent and the semiconductor nanoparticles are in an effective amount in the liquid crystal composition to form a liquid crystalline phase,
wherein the semiconducor nanoparticles are disk shaped.

29. The device of claim 10 wherein the device is a light emitting diode.

30. The liquid crystal composition of claim 7 wherein the semiconductor nanoparticles comprise a Group III–V compound semiconductor.

31. The liquid crystal composition of claim 7 wherein the semiconductor nanoparticles comprise a Group II–VI compound semiconductor.

32. The liquid crystal composition of claim 7 wherein the solvent comprises an organic solvent.

33. A device comprising the liquid crystal composition of claim 7.

34. The device of claim 33 wherein the device is a polarized light emitting diode, or a solar cell.

35. The liquid crystal composition of claim 28 wherein the semiconductor nanoparticles comprise a Group III–V compound semiconductor.

36. The liquid crystal composition of claim 28 wherein the semiconductor nanoparticles comprise a Group II–VI compound semiconductor.

37. The liquid crystal composition of claim 28 wherein the solvent comprises an organic solvent.

38. A device comprising the liquid crystal composition of claim 28.

39. The device of claim 38 wherein the device is a polarized light emitting diode, or a solar cell.

* * * * *